US005532675A

United States Patent [19]
White

[11] Patent Number: 5,532,675
[45] Date of Patent: Jul. 2, 1996

[54] ALARM TESTER

[75] Inventor: Doug White, Griffin, Ga.

[73] Assignee: Linda Johnson, Boca Raton, Fla.

[21] Appl. No.: 366,114

[22] Filed: Dec. 29, 1994

[51] Int. Cl.[6] ................................... G08B 29/00
[52] U.S. Cl. ...................... 340/515; 340/514; 324/158.1
[58] Field of Search ...................... 340/515, 514, 340/506, 649, 650, 657; 324/158 F, 158 R, 508, 509, 522–524

[56] References Cited

U.S. PATENT DOCUMENTS

| Re. 33,504 | 12/1990 | Yuhasz et al. | 307/115 |
|---|---|---|---|
| 2,250,214 | 7/1941 | Ashworth . | |
| 2,814,795 | 11/1957 | Spooner . | |
| 2,847,662 | 8/1958 | Lindgren . | |
| 3,016,525 | 1/1962 | Hauck . | |
| 3,210,615 | 10/1965 | Sherstiuk . | |
| 3,622,972 | 11/1971 | Herceg | 340/452 |
| 3,906,476 | 9/1975 | Yonezu | 340/501 |
| 3,917,001 | 11/1975 | Davis et al. | 169/61 |
| 4,309,695 | 1/1982 | Guillemot | 340/514 |
| 4,329,643 | 5/1982 | Neumann et al. | 340/514 |
| 4,418,312 | 11/1983 | Figler et al. | 340/514 |
| 4,591,731 | 5/1986 | Garcia | 307/114 |
| 4,862,142 | 8/1989 | Knight | 340/514 |
| 4,912,384 | 3/1990 | Kinoshita et al. | 318/569 |

Primary Examiner—Donnie L. Crosland
Attorney, Agent, or Firm—Willian Brinks Hofer Gilson & Lione

[57] ABSTRACT

The present invention relates to a device and method for testing circuitry, such as that provided in an alarm system. The present invention tests the circuit by providing a momentary or a continuous trigger. The testing device of the present invention is connectable by two jacks to test leads from the circuit being tested, and the circuit alarm is triggered by a relay switch either connecting or disconnecting the two jacks. The present invention additionally includes a control circuit with a power supply and a relay coil for controlling the relay switch, along with a further switch to provide two operational modes, each capable of triggering either a momentary or a continuous alarm.

7 Claims, 1 Drawing Sheet

ALARM TESTER

BACKGROUND OF THE INVENTION

The present invention relates to the testing of circuits in which an alarm is triggered by a momentary short in a normally-open circuit, or for testing the connections during installation of a normally-closed circuit.

Presently, normally-open alarm systems are tested manually by physically inserting flats, instruments similar to needle-nosed pliers, into the alarm junctions. This testing method has significant drawbacks. First, if the alarm site is remote from the alarm control center, this method requires two operators: one operator at the alarm site to trigger the alarm, and a second operator at the control center to confirm that the alarm is properly triggered and indicated at the control center. Second, the manual insertion of flats to test the alarm system exposes the operator to a safety risk. Other disadvantages also exist as a result of the imprecision of this method: depending on the wiring at the testing site of circuitry for various alarm systems, inserting flats may short out other alarm circuits. Additionally, some alarm circuit blocks used in the communications field have a power source on the same block. If the flats come into contact with the power source, the alarm circuit may be damaged.

A primary drawback of conventional normally-closed alarm systems concerns testing during installation of the system, in order to ensure that the alarm circuitry is properly installed. Presently, installers will set up an alarm system having multiple sites where the alarm can be triggered and connect cables leading from each of these sites to a central control center. Because the alarm cables are bundled together, the installer has no easy way to determine which cable comes from which site. For instance, home alarm systems typically are normally-closed systems that can be triggered by breaking the alarm circuit at various entries to the home. To determine whether the alarm circuitry is properly in place at each site, the installer can test each cable leading to an alarm site at the control center. However, if an open circuit for a particular cable does not properly trigger an alarm at any of the alarm sites, or if the operator is working alone and cannot determine whether an alarm has been triggered at a remote alarm site, the installer will not be able to easily determine at the control center which alarm site is not properly connected.

Thus, there exists a need for a device and a method allowing alarm circuitry to be tested by a single operator, and which permits the operator to test the circuitry without being exposed to safety risks. There also exists a need for a more efficient and effective method for testing whether a normally-closed alarm system has been properly installed.

SUMMARY OF THE INVENTION

Accordingly, the present invention provides a device and a method for safely testing the circuitry such as that provided in alarm systems, which are triggered by either a circuit break or a circuit short. The present invention also provides the advantage of enabling a single operator to test the alarm circuitry from a remote location.

Preferably, the present invention comprises a testing device having a first and a second jack to connect the tester to the alarm circuitry, where the two jacks are connectable by a relay switch. The preferred embodiment further comprises a control circuit, having a power supply, a relay coil, and a mode switch for switching between two operational modes. The first operational mode causes the control circuit to be normally-open by providing a normally-open control switch capable of shorting the control circuit and causing the power supply to energize the relay coil, in response to which the relay switch will connect the first and second jacks. The second operational mode causes the control circuit to be normally-closed by providing a normally-closed control switch capable of breaking the control circuit and deenergizing the relay coil, causing the relay switch to disconnect the first and second jacks.

This invention also provides a method for testing circuitry such as an alarm circuit by connecting a testing device to the alarm circuit through a first jack and a second jack, which are connectable by a relay switch, and switching between the two operational modes discussed above: the first operational mode provides a normally-open control circuit with a power supply, a relay coil, and a normally-open control switch capable of closing the normally-open control circuit, which will energize the relay coil, causing the relay switch to connect the first and second jacks. The second operational mode provides a normally-closed control circuit with a power supply, a relay coil, and a normally-closed control switch capable of opening the control circuit, which will deenergize the relay coil, causing the relay switch to disconnect the first and second jacks. The final step provided by the present invention is providing a signal through one of the normally-open or normally-closed control switches.

While the invention is especially well suited for testing alarm circuitry, it is also adaptable for testing other types of circuits to ensure that they are properly wired and operational.

As pointed out above, the present invention provides significant advantages over testing methods currently used in the industry. In addition to providing the advantages of safety and enabling remote testing by a single operator, the present invention also has the advantage of conveniently providing a single unit capable of testing alarms triggered by a circuit short as well as alarms triggered by a circuit break.

The invention itself, together with further objects and attendant advantages, will best be understood by reference to the following detailed description taken in conjunction with the accompanying drawing.

DETAILED DESCRIPTION OF THE INVENTION

Figure 1:
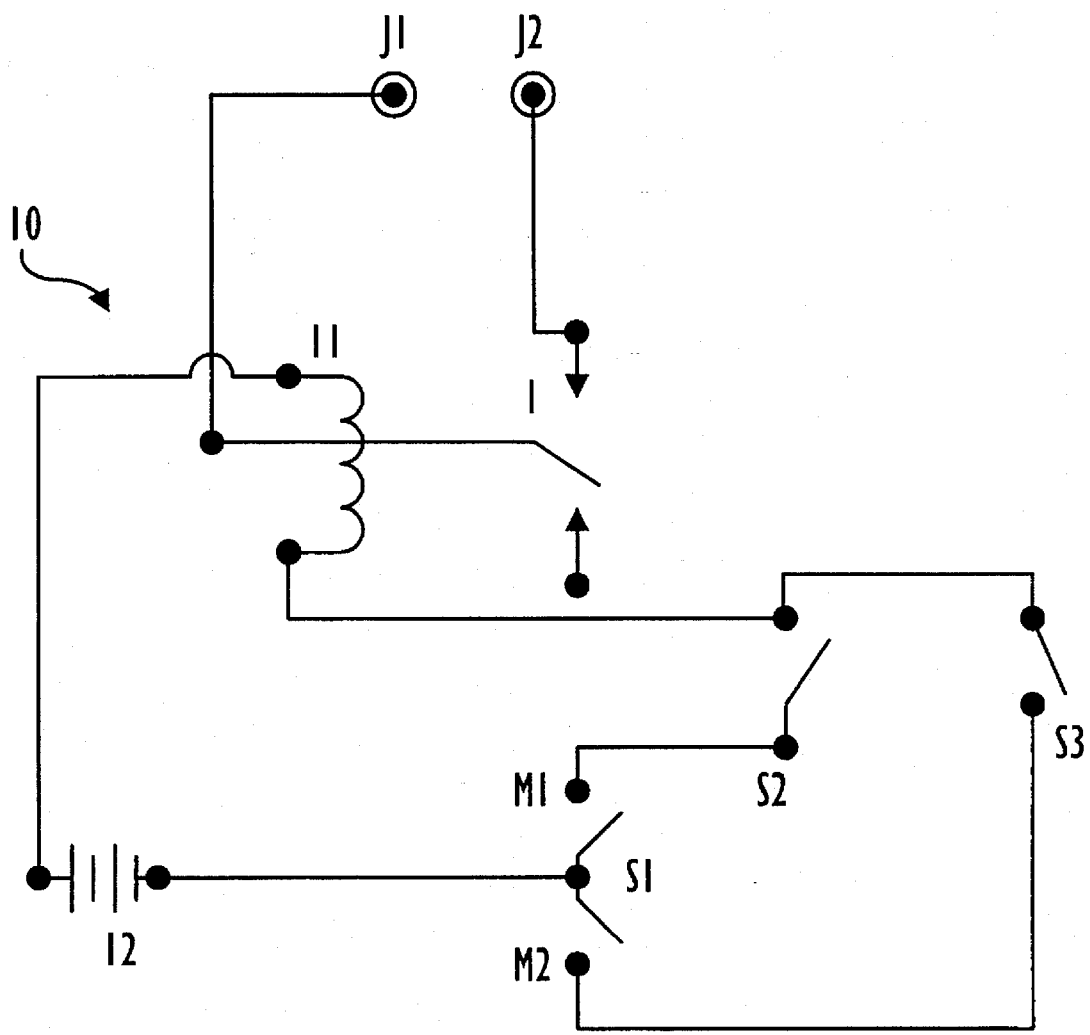
FIG. 1 shows a schematic diagram of the circuitry of a preferred embodiment of the present invention.

Turning now to the drawing, FIG. 1 is a schematic of a preferred embodiment of the present invention, comprising jacks J1, J2 to be connected to alarm circuitry for triggering an alarm, and which is controlled by a control circuit 10.

The alarm tester disclosed by the present invention in its preferred embodiment consists of two jacks J1, J2 for connecting the alarm tester to test leads from the alarm circuit to be tested, which are connectable by a relay switch 1. The relay switch 1 operates to connect or disconnect the two jacks J1, J2 in response to a relay coil 11 in a control circuit 10, which includes the relay coil 11, a power source 12, and a switching mechanism, which has a first switch S1 to complete the control circuit 10 with either a normally-open switch S2 or a normally-closed switch S3.

Alarm systems generally have test leads to enable testing of the circuitry. The alarm tester provided by the present invention tests the alarm circuitry by connecting jacks J1, J2 to these test leads and providing a signal determined by the control circuit 10 appropriate for triggering the alarm. More specifically, with the jacks connected to the test leads, when the relay switch 1 is closed, the jacks J1, J2 are connected, shorting the alarm circuit between the leads; when the relay switch 1 is open, the jacks J1, J2 are disconnected, breaking the alarm circuit between the leads.

The relay switch 1 is controlled by the control circuit 10. When the control circuit 10 is shorted, the power source 12 provides a voltage that energizes the relay coil 11, which is positioned in such a way that the magnetic field produced when energized causes the relay switch 1 to connect jacks J1, J2, which in turn will short the alarm circuitry between the test leads. Conversely, when the control circuit 10 is open, the power source 12 provides no voltage to the relay coil 11, which consequently is deenergized and causes the relay switch 1 to disconnect the jacks J1, J2, providing a break in the alarm circuit between the test leads.

As briefly mentioned above, the two basic types of alarm circuitry are normally-open circuits, which are triggered by a circuit short, and normally-closed circuits, which are triggered by a circuit break. Accordingly, the present invention provides two operational modes from which the operator may choose by positioning the mode switch S1. The novel and practical means to test an alarm system comprising a normally-open circuit will first be explained.

For testing a normally-open alarm circuit triggered by a circuit short, the present invention is capable of either providing a momentary or a continuous trigger. To provide a momentary trigger, mode switch S1 is switched to position M1, providing the first operational mode: the control circuit 10 comprises power source 12, relay coil 11, and normally-open momentary pushbutton switch S2. When normally-open momentary pushbutton switch S2 is triggered, S2 momentarily closes, providing a momentary short in the control circuit 10. As a result, the relay coil 11 is momentarily energized, causing a single closing and opening of the relay switch 1, which momentarily shorts the normally-open alarm circuit and triggers a momentary alarm.

To provide a continuous alarm trigger for a normally-open alarm circuit, the operator must be able to short the circuit for an extended period of time. This is useful when a lone operator is testing the system and the alarm site is remote from the control center, because it enables the operator to trigger the alarm at the site and return to the control center to ensure that the alarm is properly triggered. For this second operational mode, the mode switch S1 is switched to position M2: the control circuit 10 comprises power source 12, relay coil 11, and normally-closed momentary pushbutton switch S3. The control circuit 10 thus comprises a normally-closed circuit, continuously shorting the alarm circuit between the test leads until normally-closed momentary pushbutton switch S3 is opened. This should trigger a continuous alarm.

Alternatively, the alarm tester provided by the present invention can be used to test alarm systems triggered by a break in a normally-closed circuit. However, the function of the alarm tester differs in this application because a normally-closed circuit must actually be broken to trigger the alarm. Hence, connecting or disconnecting test leads from the alarm system, which effectively test only normally-open circuits, would not indicate whether the alarm system is properly functioning.

However, the alarm tester is useful for determining whether the system is properly connected at the time of system installation. As briefly mentioned above, some normally-closed alarm systems are installed by hooking up cables to each of the alarm sites, and leading the cables back to a central control center. Hence, the operator at the control center is faced with a bundle of cables, and has no easy way to determine which cable goes to which test site. As a result, there is no easy way to determine whether the cables are properly connected at the control box.

The present invention addresses this problem by providing a means for the operator to test the various cables and to determine to which site the cables are connected by enabling the tester to trigger a normally-closed alarm circuit. The second operational mode providing a normally-closed control circuit, described above for providing a continuous trigger for a normally-open alarm circuit, can also be used to provide a momentary trigger for a normally-closed alarm circuit. As discussed, to set up this mode, mode switch S1 is switched to position M2: the control circuit 10 comprises power source 12, relay coil 11, and normally-closed momentary pushbutton switch S3. When normally-closed momentary pushbutton switch S3 is triggered, S3 momentarily opens, providing a momentary break in the control circuit 10. As a result, the relay coil 11 is momentarily deenergized, causing a single opening and closing of the relay switch 1, which momentarily breaks the alarm circuit and triggers a momentary alarm.

To provide a continuous alarm trigger, which may be necessary when only one operator is testing the system and the alarm site is remote from the control center, mode switch S1 is switched to position M1, providing the first operational mode: the control circuit 10 comprises power source 12, relay coil 11, and normally-open momentary pushbutton switch S2. The control circuit 10 thus comprises a normally-open circuit, continuously providing an open alarm circuit, which would thereby trigger a continuous alarm in a properly installed alarm system. This permits the operator to set the alarm at the control center and return to the remote alarm site to ensure that the alarm has been properly triggered.

The preferred embodiment described above provides a number of significant advantages over testing methods currently used. For example, the present invention permits the operator to use a single device to test both alarms triggered by a shorted circuit or an open circuit. Additionally, as previously discussed, in situations where the the alarm site is remote from the control center, the present invention permits a single operator to perform the testing, whereas traditional methods required two operators—one operator at the alarm site, and a second operator at the control center. Yet another advantage achieved by the present invention is that the present invention provides a much safer means of testing the alarm circuitry, a marked advantage over traditional testing means in which the operator physically inserted instruments into the alarm circuitry.

Of course, it should be understood that a wide range of changes and modifications can be made to the preferred embodiment described above. It is therefore understood that it is the following claims, including all equivalents, which are intended to define the scope of this invention.

What is claimed is:

1. A device for testing a circuit comprising:
   a first and a second jack for connecting the device to the circuit, wherein the first and second jacks are connectable by a relay switch;
   a control circuit, having a power supply, a relay coil, and a mode switch for switching between two operational modes, wherein: the first operational mode causes the control circuit to be normally-open with a normally-open control switch capable of shorting the control circuit, connecting the power supply to the relay coil, energizing the relay coil which causes the relay switch to connect the first and second jacks; and the second operational mode causes the control circuit to be normally-closed with a normally-closed control switch capable of breaking the control circuit, disconnecting the power supply from the relay coil, deenergizing the relay coil which causes the relay switch to disconnect the first and second jacks.

2. The device in accordance with claim 1, wherein the mode switch comprises a single-pole-double-throw switch.

3. The device in accordance with claim 1, wherein each of the normally-open and normally-closed control switches comprises a single-pole-single-throw momentary pushbutton switch, whereby: in the first operational mode, the normally-open control switch is capable of momentarily shorting the control circuit, causing the relay switch to momentarily connect the first and second jacks; and in the second operational mode, the normally-closed control switch is capable of momentarily breaking the control circuit, causing the relay switch to momentarily disconnect the first and second jacks.

4. An alarm tester for testing an alarm circuit comprising:

a first and a second jack for connecting the tester to the alarm circuit, wherein the first and second jacks are connectable by a relay switch;

a control circuit, having a power supply, a relay coil, and a mode switch for switching between two operational modes, wherein: the first operational mode causes the control circuit to be normally-open with a normally-open control switch capable of shorting the control circuit, connecting the power supply to the relay coil, energizing the relay coil which causes the relay switch to connect the first and second jacks; and the second operational mode causes the control circuit to be normally-closed with a normally-closed control switch capable of breaking the control circuit, disconnecting the power supply from the relay coil, deenergizing the relay coil which causes the relay switch to disconnect the first and second jacks.

5. A method for testing a circuit comprising the steps of:

providing a device having a first and a second jack, wherein the first and second jacks are connectable by a relay switch;

connecting the device to the circuit through the first and second jacks;

switching the device into a first or a second operational mode, the first operational mode providing a normally-open control circuit with a power supply, a relay coil, and a normally-open control switch capable of closing the normally-open control circuit for energizing the relay coil, causing the relay switch to connect the first and second jacks; and the second operational mode providing a normally-closed control circuit with a power supply, a relay coil, and a normally-closed control switch capable of opening the normally-closed control circuit for deenergizing the relay coil, causing the relay switch to disconnect the first and second jacks; and providing a signal through one of the normally-open or normally-closed control switches.

6. The method for testing a circuit in accordance with claim 5, wherein the switching step is accomplished by switching a single-pole-double-throw switch.

7. The method for testing a circuit in accordance with claim 5, wherein each of the normally-open and normally-closed control switches is a single-pole-single-throw momentary pushbutton switch, whereby, in the first operational mode, the normally-open control switch is capable of momentarily shorting the control circuit causing the relay switch to momentarily connect the first and second jacks; and in the second operational mode, the normally-closed control switch is capable of momentarily breaking the control circuit causing the relay switch to momentarily disconnect the first and the second jacks.

* * * * *